(12) United States Patent
Zhao et al.

(10) Patent No.: US 11,744,118 B2
(45) Date of Patent: Aug. 29, 2023

(54) ARRAY SUBSTRATE, METHOD OF FABRICATING ARRAY SUBSTRATE, DISPLAY PANEL, AND METHOD OF FABRICATING DISPLAY PANEL

(71) Applicant: BOE TECHNOLOGY GROUP CO., LTD., Beijing (CN)

(72) Inventors: Dejiang Zhao, Beijing (CN); Wenqi Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/721,023

(22) Filed: Apr. 14, 2022

(65) Prior Publication Data

US 2022/0246699 A1   Aug. 4, 2022

Related U.S. Application Data

(63) Continuation of application No. 16/316,111, filed as application No. PCT/CN2018/083936 on Apr. 20, 2018, now Pat. No. 11,322,560.

(30) Foreign Application Priority Data

Apr. 27, 2017  (CN) .......................... 201710289732.0
Dec. 15, 2017  (CN) .......................... 201711354187.5

(51) Int. Cl.
*H01L 27/32*   (2006.01)
*H10K 59/122*  (2023.01)
(Continued)

(52) U.S. Cl.
CPC ......... *H10K 59/122* (2023.02); *H10K 59/121* (2023.02); *H10K 59/1201* (2023.02)

(58) Field of Classification Search
CPC .............. H01L 27/3246; H01L 27/326; H01L 2227/323
See application file for complete search history.

(56) References Cited

U.S. PATENT DOCUMENTS

2007/0252518 A1   11/2007  Lee
2008/0036374 A1    2/2008  Okano
(Continued)

FOREIGN PATENT DOCUMENTS

CN   103187539 A    7/2013
CN   104183622 A   12/2014
(Continued)

OTHER PUBLICATIONS

USPTO, Exparte Quayle Office Action issued Oct. 1, 2021 for U.S. Appl. No. 16/316,111.
(Continued)

*Primary Examiner* — Peter Bradford
(74) *Attorney, Agent, or Firm* — Houtteman Law LLC (57) ABSTRACT

The present disclosure generally relates to the field of display technology, and in particular, to an array substrate, a method of fabricating the array substrate, a display panel including the array substrate, and a method of fabricating the display panel. An array substrate includes: a base substrate; an electrode layer provided on the substrate; a first pixel defining layer on the electrode layer defining a plurality of pixel regions; and a second pixel defining layer on the first pixel defining layer, wherein the second pixel defining layer has a plurality of first grooves and a plurality of second grooves alternately arranged between two adjacent rows of pixel regions.

20 Claims, 8 Drawing Sheets

(51) Int. Cl.
*H10K 59/121* (2023.01)
*H10K 59/12* (2023.01)

(56) References Cited

U.S. PATENT DOCUMENTS

| | | | |
|---|---|---|---|
| 2009/0153044 | A1 | 6/2009 | Yanagihara |
| 2010/0213827 | A1* | 8/2010 | Yoshida ................ H10K 59/122 |
| | | | 313/504 |
| 2013/0337596 | A1 | 12/2013 | Hung et al. |
| 2016/0043150 | A1 | 2/2016 | Wang |
| 2016/0351632 | A1 | 12/2016 | Iguchi et al. |
| 2016/0359112 | A1 | 12/2016 | Wang et al. |
| 2017/0047383 | A1 | 2/2017 | Hsin |
| 2017/0104181 | A1 | 4/2017 | Lee et al. |
| 2018/0111717 | A1 | 4/2018 | Jiang |
| 2019/0371873 | A1* | 12/2019 | Cui ...................... H10K 59/122 |
| 2021/0167147 | A1* | 6/2021 | Nakatani ............. H01L 27/1218 |
| 2021/0183973 | A1* | 6/2021 | Kim .................... H01L 51/0005 |
| 2021/0202609 | A1* | 7/2021 | Park ................... H01L 27/3246 |
| 2022/0392967 | A1* | 12/2022 | Zhang ................. H10K 59/353 |

FOREIGN PATENT DOCUMENTS

| | | | | |
|---|---|---|---|---|
| CN | 104241313 | A | | 12/2014 |
| CN | 104299968 | A | | 1/2015 |
| CN | 104465671 | A | | 3/2015 |
| CN | 105206643 | A | | 12/2015 |
| CN | 205542786 | U | | 8/2016 |
| CN | 106449657 | A | | 2/2017 |
| CN | 106449717 | A | | 2/2017 |
| CN | 107895736 | A | | 4/2018 |
| CN | 207800610 | U | | 8/2018 |
| CN | 108538892 | A | * | 9/2018 ......... H01L 27/3246 |
| CN | 108538892 | A | | 9/2018 |
| CN | 109698221 | A | * | 4/2019 ......... H01L 27/3246 |
| CN | 109698221 | A | | 4/2019 |
| CN | 110323261 | A | | 10/2019 |
| CN | 110993646 | A | | 4/2020 |
| CN | 110993646 | A | * | 4/2020 ......... H01L 27/3246 |
| CN | 109698221 | B | | 4/2021 |
| EP | 2493271 | A1 | | 8/2012 |
| KR | 20160127197 | A | | 11/2016 |

OTHER PUBLICATIONS

USPTO, Notice of allowance dated Jan. 4, 2022 for U.S. Appl. No. 16/316,111.
USPTO, The extended European search report dated Dec. 21, 2020 for application No. EP18792002.0.
China Patent Office, First Office Action dated Apr. 19, 2019 for application No. CN201711354187.5.
USPTO, First Office Action dated Oct. 2, 2020 for U.S. Appl. No. 15/761,383.
USPTO, Notice of allowance dated Feb. 11, 2021 for U.S. Appl. No. 15/761,383.
China Patent Office, First Office Action dated Apr. 19, 2019 for application No. CN201710289732.0.
China Patent Office, Second Office Action dated Nov. 13, 2019 for application No. CN201710289732.0.
WIPO, International Search Report dated Dec. 27, 2017 for application No. PCT/CN2017/102905.
WIPO, International Search Report dated Jul. 6, 2018 for application No. PCT/CN2018/083936.

* cited by examiner

ARRAY SUBSTRATE, METHOD OF FABRICATING ARRAY SUBSTRATE, DISPLAY PANEL, AND METHOD OF FABRICATING DISPLAY PANEL

CROSS-REFERENCE TO RELATED APPLICATIONS

This application is a continuation application of U.S. patent application Ser. No. 16/316,111, filed on Jan. 8, 2019, a National Phase Application filed under 35 U.S.C. 371 as a national stage of PCT/CN2018/083936 filed on Apr. 20, 2018, an application claiming the benefit to Chinese Patent Application No. 201711354187.5 filed on Dec. 15, 2017 and Chinese Patent Application No. 201710289732.0 filed on Apr. 27, 2017, the entire disclosure of each of which is hereby incorporated by reference.

TECHNICAL FIELD

The present disclosure generally relates to the field of display technology, and in particular, to an array substrate, a method of fabricating the array substrate, a display panel including the array substrate, and a method of fabricating the display panel.

BACKGROUND

Organic light-emitting diode (OLED) display and liquid crystal display (LCD) are two of the most prevalent display devices in use today. OLED offers many advantages, including active light emission, high brightness, high contrast, ultra-thin, low power consumption, flexibility and bendability, and tolerance over a broad range of operating temperatures. The numerous advantages that are possible with OLED makes it a highly competitive and developable candidate for the next generation of display technology.

BRIEF SUMMARY

One embodiment of the present disclosure is an array substrate. The array substrate may comprise a base substrate; an electrode layer on the base substrate; a first pixel defining layer on the electrode layer defining a plurality of pixel regions arranged in an array of at least a first color and a second color, the second color being different from the first color; and a second pixel defining layer on the first pixel defining layer having a plurality of first grooves and a plurality of second grooves alternately arranged between two adjacent rows of pixel regions. Each of the plurality of first grooves may have at least one first opening connecting the each of the plurality of first grooves to a pixel region of the first color. Each of the plurality of second grooves may have at least one second opening connecting the each of the plurality of second grooves to a pixel region of the second color.

In at least some embodiments, the plurality of first grooves in two adjacent rows may be staggered with respect to each other along a row direction. The plurality of first grooves in two adjacent rows may be staggered by a distance substantially equal to a width of one pixel region along the row direction.

In at least some embodiments, the plurality of second grooves in two adjacent rows may be staggered with respect to each other along a row direction. The plurality of second grooves in two adjacent rows may be staggered by a distance substantially equal to a width of two pixel regions along the row direction.

In at least some embodiments, the second pixel defining layer may further comprise a plurality of raised portions, each of the plurality of raised portions being positioned to separate each of the plurality of first grooves from an adjacent second groove.

In at least some embodiments, the first color may comprise two different colors. The plurality of first grooves in two adjacent rows may be connected to the two different colors.

In at least some embodiments, a combined thickness of the first pixel defining layer and the second pixel defining layer may be in the range of about 1.2 µm to about 2.5 µm. In other embodiments, a combined thickness of the first pixel defining layer and the second pixel defining layer may be in the range of about 1.5 µm to about 5 µm.

In at least some embodiments, each of the plurality of first grooves does not penetrate the second pixel defining layer. In other embodiments, each of the plurality of first grooves may penetrate the second pixel defining layer.

In at least some embodiments, a width of each of the plurality of first grooves in a row direction may be about five times larger than a width of each of the plurality of second grooves in the row direction.

In at least some embodiments, each of the plurality of second grooves may comprise a first wall separating the second groove from an adjacent first groove, and a second wall separating the second groove from an adjacent pixel region of the second color. the at least one second opening may be formed in the second wall, and has a width in a row direction that is smaller than a width of the second wall in the row direction.

Another embodiment of the present disclosure is a display panel. The display panel may comprise an array substrate as described above, and a light-emitting layer formed in the plurality of pixel regions.

Another embodiment of the present disclosure is a method of fabricating an array substrate. The method may comprise forming the electrode layer on the base substrate; forming the first pixel defining layer on the electrode layer; and forming the second pixel defining layer on the first pixel defining layer. The second pixel defining layer may have the plurality of first grooves and the plurality of second grooves.

In at least some embodiments, the step of forming the first pixel defining layer may comprise depositing a first pixel defining film on the electrode layer; and patterning the first pixel defining film into the first pixel defining layer. The step of forming the second pixel defining layer may comprise depositing a second pixel defining film on the first pixel defining layer; and patterning the second pixel defining film into the second pixel defining layer.

In at least some embodiments, the first pixel defining layer and the second pixel defining layer are formed in a single patterning step. The single patterning step may comprise depositing a first pixel defining film on the electrode layer; depositing a second pixel defining film on the first pixel defining film; and patterning the first pixel defining film and the second pixel defining film simultaneously to form the first pixel defining layer and the second pixel defining layer.

Another embodiment of the present disclosure is a method of fabricating a display panel. The method may comprise providing an array substrate as described above; dripping a first light emitting material into the plurality of first grooves; and dripping a second light emitting material into the plurality of second grooves.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function of the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

An OLED display panel generally includes an array substrate and a cover layer. OLED pixel units are formed on the array substrate, and the cover layer is formed on the pixel units. Each OLED pixel unit generally includes an electrode, an organic thin film layer, and another electrode sequentially disposed on the array substrate. The organic thin film layer mainly includes a hole injection layer, a hole transport layer, an organic light-emitting layer, and an electron transport layer stacked on the electrode.

An OLED may be divided into two types—a bottom-emitting type and a top-emitting type, depending on the direction of emergent light. A bottom-emitting OLED (BE-OLED) generally includes a cathode, an electron transport layer, a light emitting layer, a hole transport layer, a transparent anode, and a substrate arranged sequentially in a transmission direction of light. Indium tin oxide (ITO) is generally used in the transparent anode, and light exits from a side of the OLED where the substrate is located, on which substrate the ITO material is provided. Such an OLED is therefore referred to as a bottom-emitting OLED. On the other hand, a top-emitting OLED (TEOLED) generally includes a cathode, an electron transport layer, a light emitting layer, a hole transport layer, a reflective anode, and a substrate arranged sequentially in the reverse transmission direction of the light. Light exits from a side of the OLED where the cathode is located, so as to be referred as a top-emitting OLED.

An OLED pixel unit is manufactured generally in one of two ways: the first is by vapor deposition, and the second is by inkjet printing. Vapor deposition allows the production of a full-color OLED product, and can generate extremely high resolution, but material utilization is low. Further, to produce a large-size display, a white OLED (i.e., the WRGB (white, red, green, and blue) method) must be employed. On the other hand, during inkjet printing, ink (for example, composed of a liquid organic material) is uniformly deposited to form an organic thin film layer. Inkjet printing allows a high material utilization rate and can produce large-size full-color display panels.

However, conventional inkjet printing technology, and its application to the production of LED display panels, is not without limitations. For example, it is generally difficult to obtain high-resolution when using conventional inkjet printing technology to print small and medium sizes, due to limitations in the volume of the ink droplets and printing accuracy. Further, the instability of the conventional inkjet printing apparatus also generally makes the printing process difficult. Thus, there is a need to significantly improve the conventional inkjet printing technology, for example, in order to increase print resolution.

An apparatus for ink jet printing generally includes a plurality of nozzles arranged side by side. Each area corresponding to a sub-pixel is aligned with a nozzle, and during printing, the nozzles move and dispense ink to form the sub-pixels. More particularly, after printing a row of sub-pixels, the nozzles are moved and repositioned to print the next row of sub-pixels, and after each repositioning, the nozzles dispense ink. For products with a larger number of pixels per inch (PPI), the number of ink dispensing operations that each nozzle must perform increases. This operation on a larger scale can be problematic in terms of control of the nozzles on the one hand, and control of the uniform size of the ink droplets during successive dispensing of the ink on the other.

Embodiments of the present disclosure utilize a double-layer structure for the pixel defining layers. A first pixel defining layer comprising a plurality of pixel regions is provided on a substrate. A second pixel defining layer is formed on the first pixel defining layer at a position between two adjacent rows of pixel regions. The second pixel defining layer has a plurality of first grooves and a plurality of second grooves. The first grooves and the second grooves are arranged in an alternating manner. A first opening is provided on at least one portion of a first groove adjacent to a pixel region of a first color. The first opening is configured to connect a plurality of pixel regions of the first color with the first groove. A second opening is provided on at least one portion of a second groove adjacent to a pixel region of a second color. The second opening is configured to connect a plurality of pixel regions of the second color with the second groove. The first color and the second color are different. When using inkjet printing to form the array substrate, light emitting materials are dispensed by the printer nozzles directly into the first and second grooves. More particularly, a light emitting material of the first color is directly deposited into the first groove, and the flows into the corresponding pixel regions that are connected to the first groove via the first opening. A light emitting material of the second color is deposited into the second groove, and flows into the corresponding pixel regions that are connected to the second groove via the second opening. The double-layer structure of the pixel defining layers makes is possible to simultaneously print light emitting layers in adjacent rows of pixel regions. An advantage of the embodiments of the present disclosure is that, without making extensive, wholesale modifications to existing inkjet printing equipment, print resolution can be significantly improved, and the ease of operating the inkjet printing equipment can be facilitated.

Figure 1:
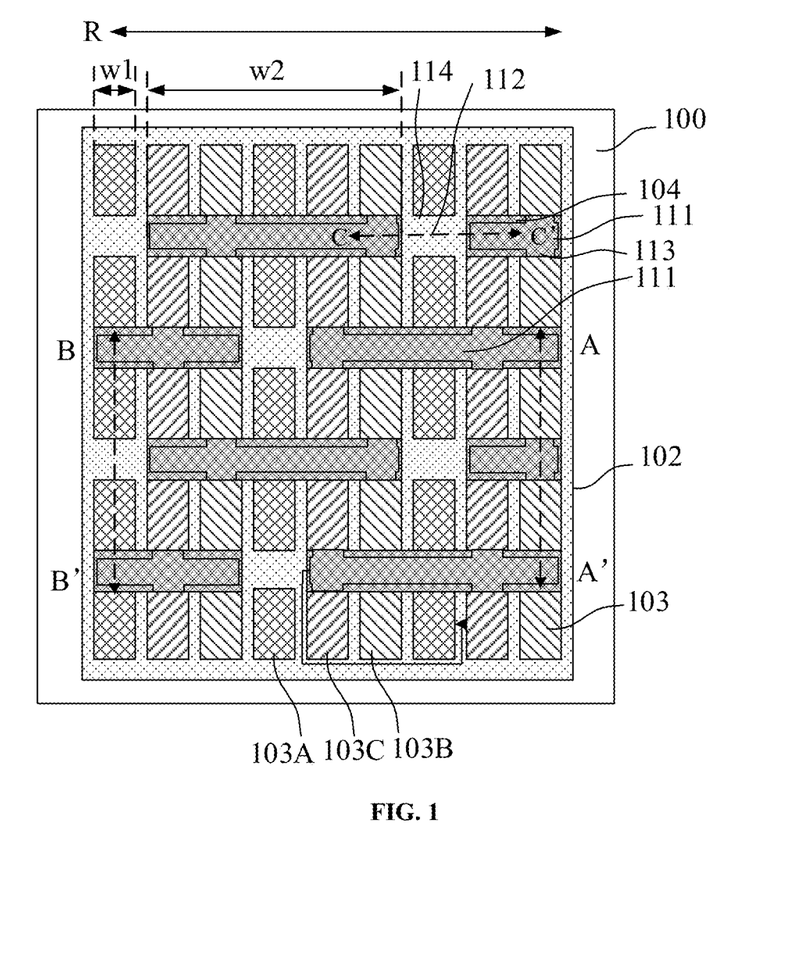
FIG. 1 shows a schematic diagram of an array substrate according to an embodiment of the present disclosure.
Figure 2A:
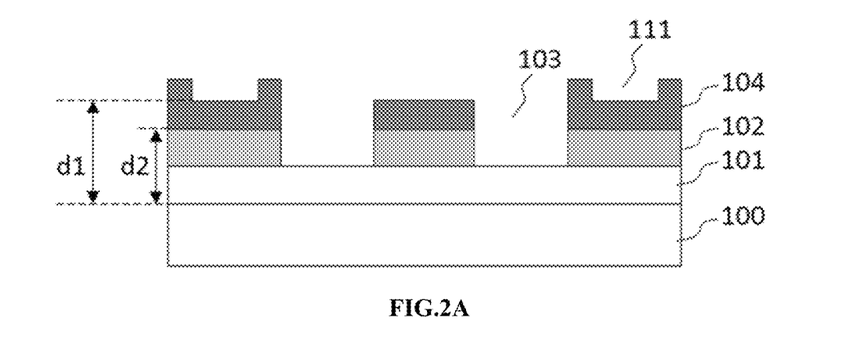
FIG. 2A shows a cross-sectional view of the array substrate exemplified in FIG. 1 along the section line A-A'.
Figure 2B:
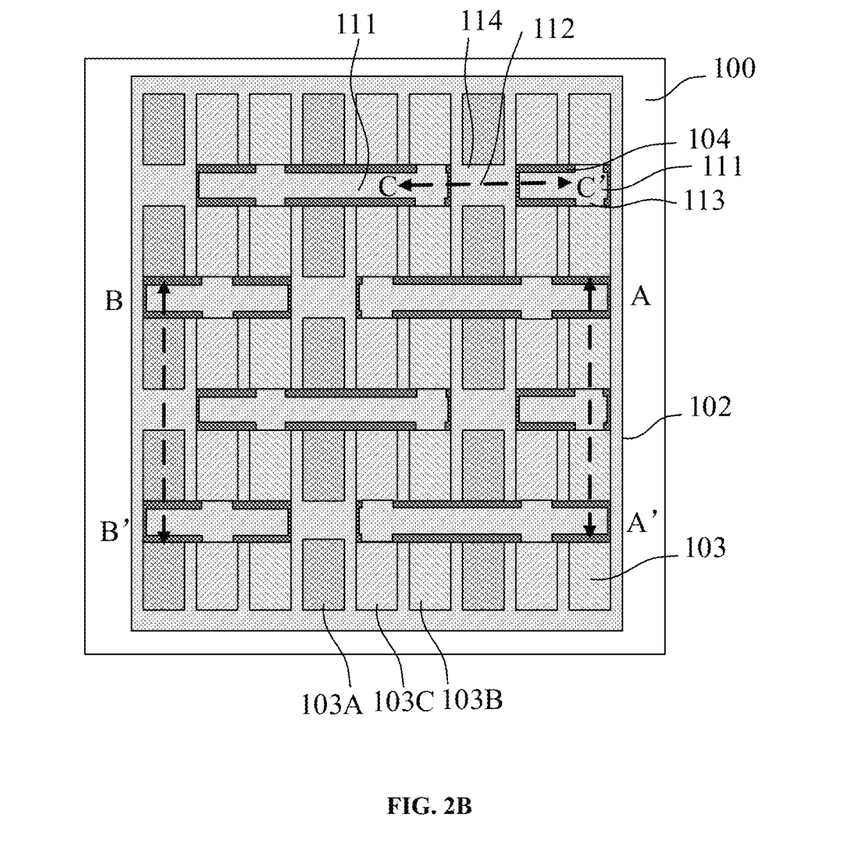
FIG. 2B shows a schematic diagram of an array substrate according to an embodiment of the present disclosure.
Figure 3A:
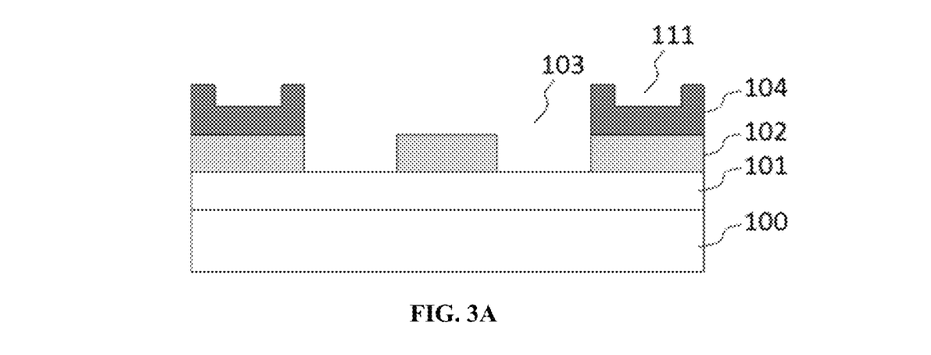
FIG. 3A shows a cross-sectional view of the array substrate exemplified in FIG. 1 along the section line B-B'.
Figure 3B:
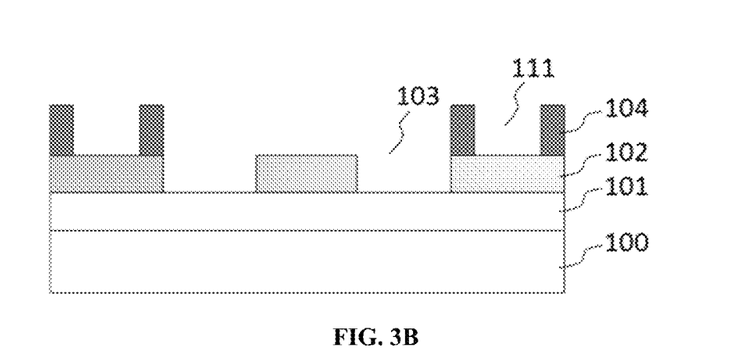
FIG. 3B shows a cross-sectional view of the array substrate exemplified in FIG. 2B along the section line B-B'.

FIG. 1 shows a schematic diagram of an array substrate according to an embodiment of the present disclosure. FIG. 2 shows a cross-sectional view of the array substrate illustrated in FIG. 1 along the section line A-A'. FIG. 3A shows a cross-sectional view of the array substrate illustrated in FIG. 1 along the section line B-B'. FIG. 3B shows a cross-sectional view of the array substrate exemplified in FIG. 2B along the section line B-B';

As shown in FIGS. 1 to 3, the array substrate comprises a base substrate 100, an electrode layer 101 formed on the base substrate 100, and a first pixel defining layer 102 formed on the base substrate 100. The first pixel defining layer 102 comprises a plurality of pixel regions 103 arranged in a plurality of rows, so that in a top view (for example, as shown in FIG. 1) of the array substrate, the base substrate 100 looks to be subdivided into a plurality of pixel regions. The first pixel defining layer comprises a plurality of first pixel defining portions provided between adjacent rows of pixel regions. The first pixel defining portions are thus arranged into a plurality of rows, each row being positioned between adjacent rows of pixel regions, for example, as shown in FIG. 1. The first pixel defining layer 102 has a thickness of about 0.3 μm to about 0.8 μm.

A second pixel defining layer 104 is formed on the first pixel defining layer 102. More particularly, the second pixel defining layer 104 comprises a plurality of second pixel defining portions that are formed on the first pixel defining portions at the position between adjacent rows of pixel regions. The second pixel defining portions are thus arranged into a plurality of rows, each row being positioned between adjacent rows of pixel regions, for example, as shown in FIG. 1. The second pixel defining layer 104 has a thickness of about 1.5 μm to about 2 μm.

In a top-emitting OLED (TEOLED), the cathode is generally configured to be thin. If the first pixel defining layer and the second pixel defining layer are made too thick, there is the risk of breakage in the cathode. The combined thickness of the first pixel defining layer and the second pixel defining layer is in the range of about 1.2 μm to about 2.5 μm. The combined thickness of the first pixel defining layer and the second pixel defining layer measures the vertical distance from the bottom surface of the first pixel defining layer to the top surface of the second pixel defining layer. In some embodiments, a ratio of the thickness of the first pixel defining layer to the thickness of the second pixel defining layer is in the range of 1:3 to 1:4.

On the other hand, in a bottom-emitting OLED (BE-OLED), the cathode is generally configured to be thicker than in a TEOLED. The combined thickness of the first pixel defining layer and the second pixel defining layer is in the range of about 1.5 μm to about 5 μm. The combined thickness of the first pixel defining layer and the second pixel defining layer measures the vertical distance from the bottom surface of the first pixel defining layer to the top surface of the second pixel defining layer. In some embodiments, a ratio of the thickness of the first pixel defining layer to the thickness of the second pixel defining layer is in the range of 1:3 to 1:4.

The second pixel defining layer 104 comprises a plurality of first grooves 111 and a plurality of second grooves 112. A second groove 112 is between two adjacent first grooves 111. In some embodiments, for example, as shown in FIG. 1, the first grooves 111 and the second grooves 112 are arranged in an alternating manner. In some embodiments, the first grooves 111 and the second grooves 112 are arranged consecutively in the row direction of the pixel regions 103. The row direction is also the direction in which the pixel regions 103 are arranged, as indicated by the arrow R in FIG. 1.

In some embodiments of the present disclosure, as shown in FIGS. 1 and 2A, the distance d1 between the bottom of the first groove 111 and the top surface of the base substrate 100 facing the first groove 111 is greater than the distance d2 between the top surface of the first pixel defining layer 102 and the top surface of the base substrate 100. The top surface of the first pixel defining layer 102 refers to the surface that is on a side of the first pixel defining layer 102 opposite from the electrode layer 101. In these embodiments, the first groove 111 does not penetrate the second pixel defining layer 104.

Figure 2C:
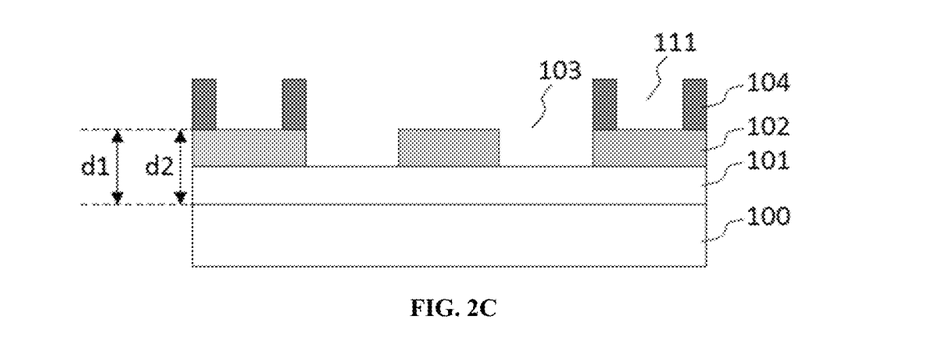
FIG. 2C shows a cross-sectional view of the array substrate exemplified in FIG. 2B along the section line A-A'.

In other embodiments of the present disclosure, as shown in FIGS. 2B and 2C, the distance d1 between the bottom of the first groove 111 and the top surface of the base substrate 100 is equal to the distance d2 between the top surface of the first pixel defining layer 102. In these embodiments, the first groove 111 penetrates the second pixel defining layer 104. The top surface of the first pixel defining layer 102 defines the bottom of the first groove 111. The production of these embodiments can be simpler as compared to the production of embodiments where the first groove 111 does not penetrate the second pixel defining layer 104.

At least one first opening 113 is formed on a first groove 111. The first opening 113 is formed on a portion of the first groove 111 that adjacent to a pixel region 103 of a first color, so that the first opening 113 is configured to connect the first groove 111 to the pixel region 103 of the first color.

At least one second opening 114 is formed on a second groove 112. The second opening 114 is formed on a portion of the second groove 112 adjacent to a pixel region 103 of a second color, so that the second opening 114 is configured to connect the second groove 112 to the pixel region 103 of the second color. The second color is different from the first color.

The first grooves 111 on adjacent rows of second pixel defining portions 104 are arranged so as to be staggered with respect to each other. The first grooves 111 on adjacent rows of second pixel defining portions 104 are staggered in the row direction of the pixel regions 103 (for example, as shown in FIG. 1). The row direction is also the direction in which the pixel regions 103 are arranged.

The second groove 114 may be configured in the manner shown in FIG. 1, and more particularly, defined by the second pixel defining portions 104 on the two sides of a second groove 112 that are adjacent to the first grooves 111. The second pixel defining portions 104 are not present on the two sides of the second groove 112 that are adjacent to the pixel regions 103.

As shown in FIG. 1, the second grooves 112 in adjacent rows of second pixel defining portions 104 are staggered in the row direction of the pixel regions 103 (for example, as shown in FIG. 1).

Figure 4A:
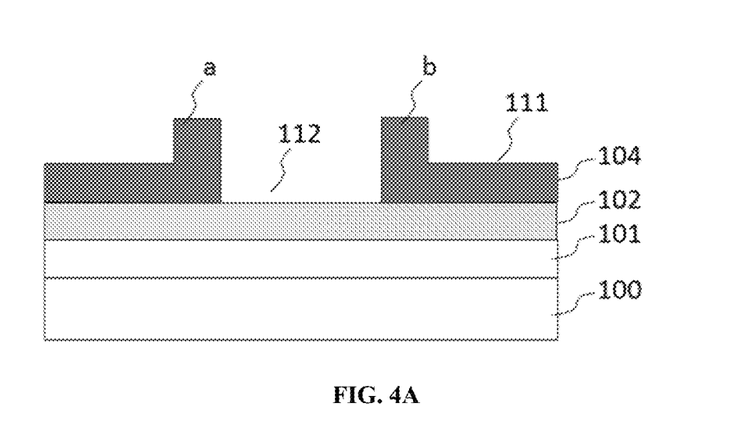
FIG. 4A shows a cross-sectional view of the array substrate exemplified in FIG. 1 along the section line C-C'.
Figure 4B:
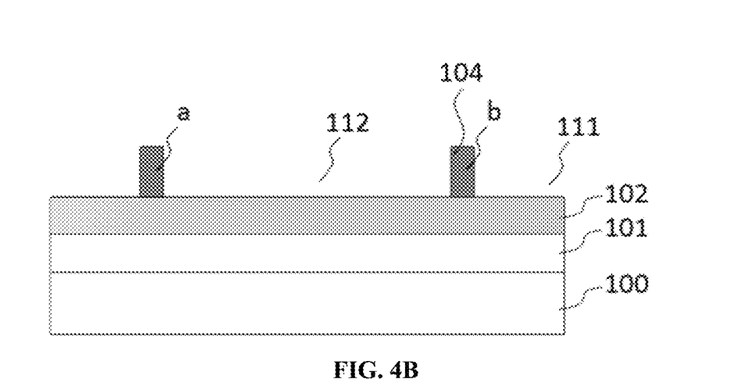
FIG. 4B shows a cross-sectional view of the array substrate exemplified in FIG. 2B along the section line C-C'.

FIG. 4A shows a cross-sectional view of the array substrate illustrated in FIG. 1 along the section line C-C'. FIG. 4B shows a cross-sectional view of the array substrate exemplified in FIG. 2B along the section line C-C'.

Figure 5:
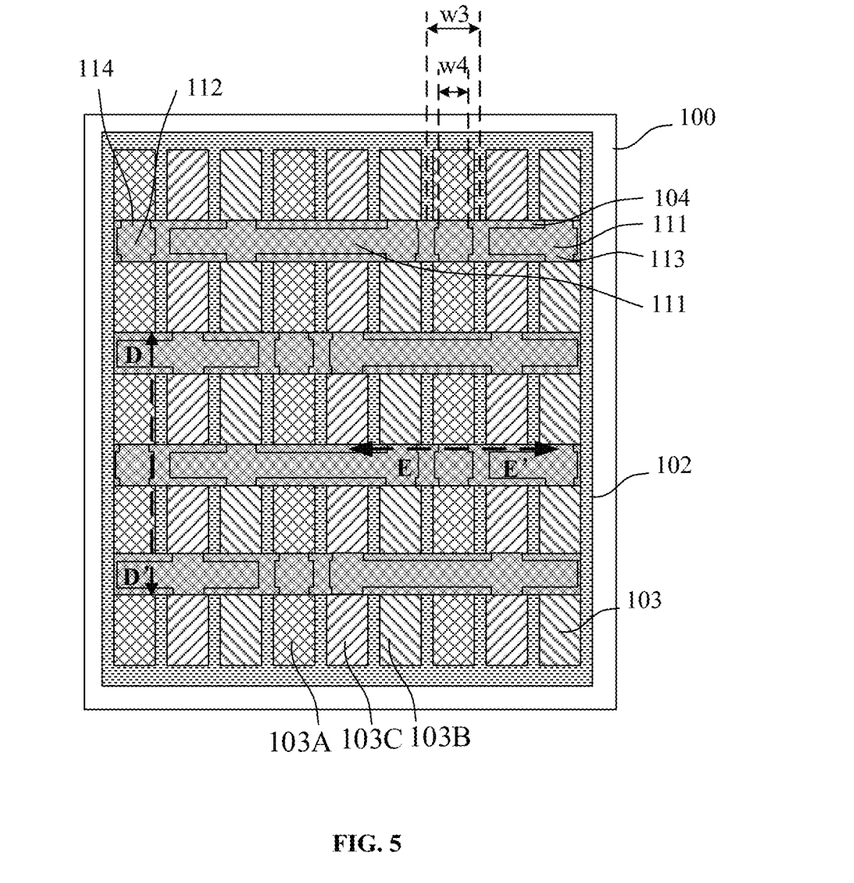
FIG. 5 shows a schematic diagram of an array substrate according to another embodiment of the present disclosure.
Figure 7:
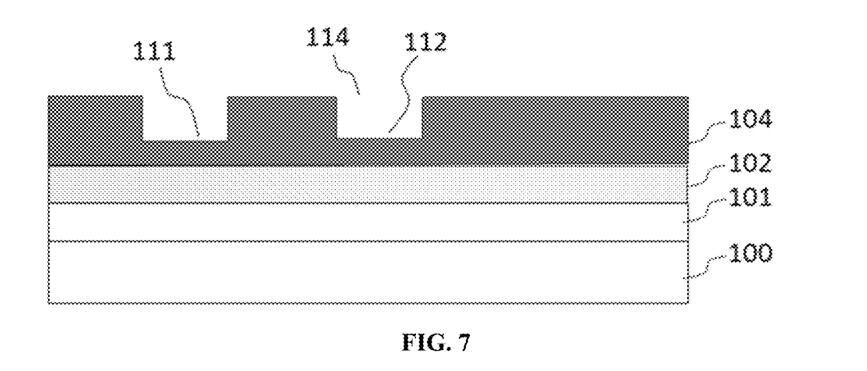
FIG. 7 shows a cross-sectional view of the array substrate exemplified in FIG. 5 along the section line E-E'.

As shown in FIGS. 1 to 4, adjacent first groove 111 and second groove 112 are separated by the raised portions a, b in the second pixel defining layer 104. The raised portions a, b are formed in the second pixel defining layer 104, for example, as shown in FIGS. 4A and 4B. The raised portions a, b serve as a first wall that separates a second groove 112 from adjacent first grooves 111. Further, in the embodiments illustrated in FIG. 5, the second pixel defining portions 104 are present on the two sides of the second groove 112 adjacent to the pixel regions 103, thereby forming a second wall that separates the second groove 112 from the adjacent pixel regions 103. As shown in FIG. 5, the second opening 114 is formed in the second wall, and has a width w4 in the row direction that is narrower than a width w3 of the second wall in the row direction. FIG. 7 shows a cross-sectional view of the array substrate exemplified in FIG. 5 along the section line E-E'. As shown in FIG. 7, the second opening 114 is formed in the second wall separating the second groove 112 from the adjacent pixel region 103. The second groove 112 is therefore defined by the raise portions a, b in the second pixel defining layer 104, and the second opening 114. The second opening 114 is configured to connect the second groove 112 to pixel regions 103 of a color that is different from the color of the pixel regions 103 that are connected to the first groove 111 via the first opening 113.

The second pixel defining portions 104 are not present on the two sides of the second groove 112 adjacent to pixel regions 103, for example, as shown in FIG. 1. This configuration can reduce the amount of materials necessary to form the array substrate. The second pixel defining portions 104 are not present in the second groove 112 between two adjacent rows of pixel regions 103, or on the first pixel defining layer 102 between two adjacent rows of pixel regions 103. Light emitting material can be directly deposited into the second groove 112, and can flow into the adjacent pixel regions 103 connected to the second groove 112. Even in situations where the light emitting material residues remain on the first pixel defining layer 102, which is between two adjacent pixel regions 103, the residues will have minimal or no effects on the light emitting function of the display panel incorporating the array substrate. The display panel controls light emissions by the light emitting materials through the electrode layer 101, but any light emitting material residues that remain on the first pixel defining layer 102 would not be in contact with the electrode layer 101, and as such, would not negatively impact the light emissions of the display panel.

FIG. 5 shows a schematic diagram of an array substrate according to another embodiment of the present disclosure. A difference between the embodiments exemplified in FIG. 1 and FIG. 5 is the structure and configuration of the second groove 112.

As shown in FIG. 5, the second pixel defining portions 104 are present on the two sides of the second groove 112 adjacent to the pixel regions 103. The second openings 114 are provided on the two sides of the second pixel defining portions 104 adjacent to the pixel regions 103. The second openings 114 are configured to connect the second groove 112 to pixel regions 103 of a color that is different from the color of the pixel regions 103 that are connected to the first groove 111 via the first opening 113.

Figure 6:
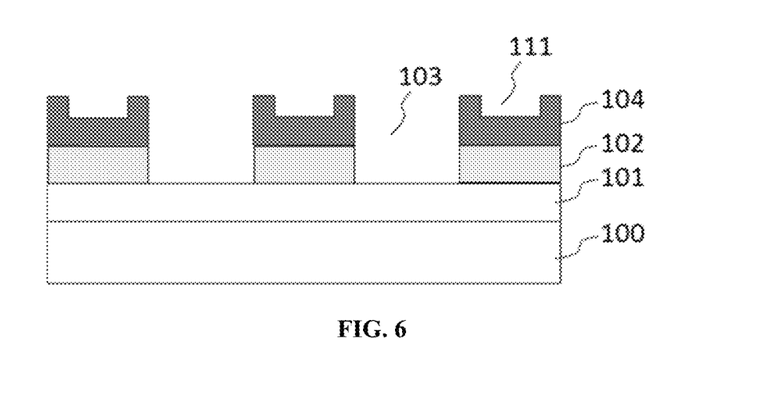
FIG. 6 shows a cross-sectional view of the array substrate exemplified in FIG. 5 along the section line D-D'.

FIG. 6 shows a cross-sectional view of the array substrate exemplified in FIG. 5 along the section line D-D'.

At the position of the second groove 112, the second pixel defining portions 104 are provided on the first pixel defining portions 102. The second groove 112 and the second openings 114 are then formed in the second pixel defining portions 104. The second openings 114 are provided on the two sides of the second groove 112 adjacent the pixel regions 103.

In the array substrate exemplified in FIGS. 5 and 6, when printing the light emitting layer in the pixel regions 103 connected to the second groove 112, light emitting material is deposited directly into the second groove 112, and through the second openings 114, flows into the corresponding pixel regions 103.

As shown in FIGS. 1 and 5, in one row of the second pixel defining portions 104, a first opening 113 is formed on a side of the first groove 111 adjacent to pixel regions 103 of a first color 103B (represented by the downward slanting line pattern in the figures). The first opening 113 is configured to connect the first groove 111 to the pixel regions 103 of the first color. The second opening 114 is formed on a side of the second groove 112 adjacent to pixel regions 103 of a second color 103A (represented by the diamond pattern in the figures). The second color is different from the first color. In an adjacent row of the second pixel defining portions 104, a first opening 113 is formed on a side of the first groove 111 adjacent to pixel regions 103 of a third color 103C (represented by the upward slanting line pattern in the figures). The first opening 113 is configured to connect the first groove 111 to the pixel regions 103 of the third color. The first, second, and third colors are different from each other.

More particularly, as shown in FIGS. 1 and 5, in the first row of the second pixel defining portions 104, the first groove 111 and pixel regions of the first color 103B are connected via the first opening 113. In the same row of the second pixel defining portions 104, the second groove 112 and pixel regions of the second color 103A are connected via the second opening 114. In the second row of the second pixel defining portions 104, the first groove 111 and pixel regions of the third color 103C are connected via the first opening 111, and the second groove 112 remains connected to pixel regions of the second color 103A via the second opening 114.

The distribution and arrangement of the color pixel regions are not particularly limited. The color pixel regions may be distributed and arranged in any manner known to a person of ordinary skill in the art to be suitable within the spirit and scope of the present disclosure. For example, in some embodiments, the first color may be red, the second color blue, and the third color green. In some embodiments, the first color may be green, the second color blue, and the third color red. In some embodiments, the first color may be blue, the second color red, and the third color green. In some embodiments, the first color may be green, the second color red, and the third color blue. In some embodiments, the first color may be red, the second color green, and the third color blue. In some embodiments, the first color may be blue, the second color green, and the third color red.

In some embodiments of the present disclosure, the second pixel defining portions 104 are provided on the first pixel defining portions 102 at the position between two adjacent rows of pixel regions 103. When the light emitting layer is subsequently printed using inkjet printing, a light emitting material of the first color is directly deposited into the first groove 111, and flows into the corresponding pixel regions 103 that are connected to the first groove 111 via the first opening 113. This allows for simultaneous printing of light emitting layers in adjacent rows of pixel regions, which can in turn improve print resolution and simplify operation of the inkjet printing equipment.

In some embodiments of the present disclosure, first and second grooves 111, 112 in odd numbered rows of second pixel defining portions 104 are aligned with each other in the row direction of the pixel regions 103. That is, the first grooves 111 in odd numbered rows of second pixel defining portions 104 are aligned with each other, and the second grooves 112 in odd numbered rows of second pixel defining portions 104 are aligned with each other. Conversely, first and second grooves 111, 112 in even numbered rows of second pixel defining portions 104 are aligned with each other in the row direction of the pixel regions 103. That is, the first grooves 111 in even numbered rows of second pixel defining portions 104 are aligned with each other, and the second grooves 112 in even numbered rows of second pixel defining portions 104 are aligned with each other.

For example, as shown in FIGS. 1 and 5, the first and second grooves 111, 1112 in the first and third rows of second pixel defining portions 104 are aligned, and the first and second grooves 111, 112 in the second and fourth rows of second pixel defining portions 104 are aligned.

In other words, first and second grooves 111, 112 in even and odd numbered rows of second pixel defining portions 104 are staggered with respect to each other in the row direction of the pixel regions 103. That is, the first grooves 111 in an odd numbered row of second pixel defining portions 104 are staggered with respect to the first grooves 111 in an even numbered row of second pixel defining portions 104.

Likewise, the second grooves 111 in an odd numbered row of second pixel defining portions 104 are staggered with respect to the second grooves 113 in an even numbered row of second pixel defining portions 104.

For example, as shown in FIGS. 1 and 5, the first grooves 111 in the first and second rows of second pixel defining portions 104 are staggered by a distance substantially equal to a width of one pixel region 103 (in the figures, one pixel region of the second color 103A). The width w1 of a pixel region is measured in the row direction, as shown in FIG. 1. In other words, the first grooves 111 in the first and second rows of second pixel defining portions 104 are arranged so as to overlap by two pixel regions (in the figures, one pixel region of the first color 103B and one pixel region of the third color 103C).

The second grooves 112 in the first and second rows of second pixel defining portions 104 are staggered by a distance substantially equal to a width of two pixel regions 103 (in the figures, one pixel region of the first color 103B and one pixel region of the third color 103C). The width w1 of a pixel region is measured in the row direction, as shown in FIG. 1.

As shown in FIGS. 1 and 5, the number of pixel regions of the first color 103B that are connected to the first groove 111 in the first row of second pixel defining portions 104 is four (4), and the number of pixel regions of the third color 103C that are connected to the first grooves 111 in the second row of second pixel defining portions 104 is four (4). The number of pixel regions of the second color 103A that are connected to the second grooves 111 in any given row of second pixel defining portions 104 is two (2).

During inkjet printing, each first groove 111 is aligned with a nozzle on the inkjet printer, and each second groove 112 is aligned with another nozzle. When the nozzle deposits light emitting material having the first color in the first groove 111, the configuration of the first openings 113 allows the light emitting material to flow simultaneously into four (4) pixel regions 103B. Similarly, when the nozzle deposits light emitting material having the third color in the first groove 111 in a different row of second pixel defining portions 104, the configuration of the first openings 113 allows the light emitting material to flow simultaneously into four (4) pixel regions 103C. When the nozzle deposits light emitting material having the second color in the second groove 112, the configuration of the second openings 114 allows the light emitting material to flow simultaneously into two (2) pixel regions 103A.

In the embodiment illustrated in FIG. 1, since the second pixel defining portions 104 are not present on the sides of the second groove 112 adjacent to the pixel regions 103, a printer nozzle having a larger volume may be used to deposit light emitting material having the second color simultaneously in both the second groove 112 and the two pixel regions 103A connected to the second grooves 112. The lighting emitting material can distribute evenly through the second openings 114, so that even if light emitting material residues remain in the second groove 112, the residues would not affect the light emission of the display panel incorporating the array substrate. Conversely, in the embodiment illustrated in FIG. 5, since the second pixel defining portions 104 are present on the sides of the second groove 112 adjacent to the pixel regions 103, light emitting material having the second color is deposited in the second groove 112. The light emitting material then flows into the pixel regions of the second color 103A via the second openings 114.

Conventionally, an inkjet printing apparatus is equipped with a plurality of nozzles, each of which is aligned with a row of pixel regions, so that the number of nozzles required is usually equal to the number of rows of pixel regions. During printing, the nozzles are moved as necessary to deposit ink in each of the pixel regions. Products with high PPI (pixels per inch) requires high pixel density, so that the inkjet printing apparatus used to produce such products must be equipped with nozzles that are also arranged in high density. The design, construction, and operation of such an inkjet printing apparatus are necessarily complex. In contrast, the present disclosure advantageously reduces the number of nozzles needed for inkjet printing, and in so doing, greatly simplifies the construction and operation of any necessary printing apparatus.

For example, embodiments of the present disclosure can reduce the number of nozzles necessary to print pixel regions corresponding to the first color 103B by ¼, the number of nozzles necessary to print pixel regions corresponding to the first color 103C by ¼, and the number of nozzles necessary to print pixel regions corresponding to the second color 103A by ½. The number of nozzles needed to fill all the pixel regions 103 is considerably smaller than in conventional inkjet printing techniques, and as a result, the construction and operation of any inkjet printing apparatus employed to produce an array substrate according to the present disclosure can be greatly simplified.

In addition, since light emitting layers can be formed in four pixel regions 103 simultaneously with a single deposit of the light emitting material in the first groove 111, the printing process itself can be greatly simplified. The process is made all the more simpler by allowing a single deposit of light emitting material in the second groove 112 to form light emitting layers simultaneously in two pixel regions 103.

In some embodiments of the present disclosure, the first grooves 111 may have a larger surface area than the second grooves 112, so as to improve print precision. In some embodiments, a width of the first groove 111 is about five times larger than a width of the second groove 112. The width of the first and second groove 111, 112 is measured in the row direction. For example, the width of a first groove 111 is shown as w2 in FIG. 1, and the width of a second groove 112 (not shown in the figures) would be measured in the same direction. Meanwhile, the configuration of the second grooves 112 according to the present disclosure, which allows a single deposit of light emitting material in the second groove 112 to form light emitting layers simultaneously in two pixel regions 103, can improve print resolution.

In some embodiments of the present disclosure, the first pixel defining layer 102 and the second pixel defining layer 104 are formed simultaneously. That is, the first pixel defining layer 102 and the second pixel defining layer 104 are formed in a single patterning step. However, in some embodiments of the present disclosure, the first pixel defining layer 102 and the second pixel defining layer 104 are formed in a double-patterning process, where a first patterning step forms the first pixel defining layer 102, and a second patterning step forms the second pixel defining layer 104 on the first pixel defining layer 102.

Embodiments of the present disclosure utilize a double-layer structure for the pixel defining layers. A first pixel defining layer comprising a plurality of pixel regions is provided on a substrate. A second pixel defining layer is formed on the first pixel defining layer at a position between two adjacent rows of pixel regions. The second pixel defining layer has a plurality of first grooves and a plurality of second grooves. The first grooves and the second grooves are arranged in an alternating manner. A first opening is provided on at least one portion of a first groove adjacent to a pixel region of a first color. The first opening is configured to connect a plurality of pixel regions of the first color with the first groove. A second opening is provided on at least one portion of a second groove adjacent to a pixel region of a second color. The second opening is configured to connect a plurality of pixel regions of the second color with the second groove. The first color and the second color are different. When using inkjet printing to form the array substrate, light emitting materials are dispensed by the printer nozzles directly into the first and second grooves. More particularly, a light emitting material of the first color is directly deposited into the first groove, and the flows into the corresponding pixel regions that are connected to the first groove via the first opening. A light emitting material of the second color is deposited into the second groove, and flows into the corresponding pixel regions that are connected to the second groove via the second opening. The double-layer structure of the pixel defining layers makes is possible to simultaneously print light emitting layers in adjacent rows of pixel regions. An advantage of the embodiments of the present disclosure is that, without making extensive, wholesale modifications to existing inkjet printing equipment, print resolution can be significantly improved, and the ease of operating the inkjet printing equipment can be facilitated.

The present disclosure also provides a display panel. The display panel may comprise an array substrate as described above, for example, according to one or more of the embodiments exemplified in FIGS. 1 to 6.

The display panel according to the present disclosure comprises a light emitting layer formed in each pixel region 103. Using inkjet printing, first light emitting layers are formed in the pixel regions of the first color 103B, second light emitting layers in the pixel regions of the second color 103A, and third light emitting layers in the pixel regions of the third color 103C.

The display panel according to the present disclosure incorporates an array substrate having a double-layer pixel defining layer structure. The double-layer structure of the pixel defining layers makes is possible to simultaneously print light emitting layers in multiple pixel regions, so that without requiring extensive, expensive, and wholesale modifications to existing inkjet printing equipment, remarkable improvements could be obtained in print resolution and the operation of the inkjet printing equipment could be greatly simplified.

Figure 8:
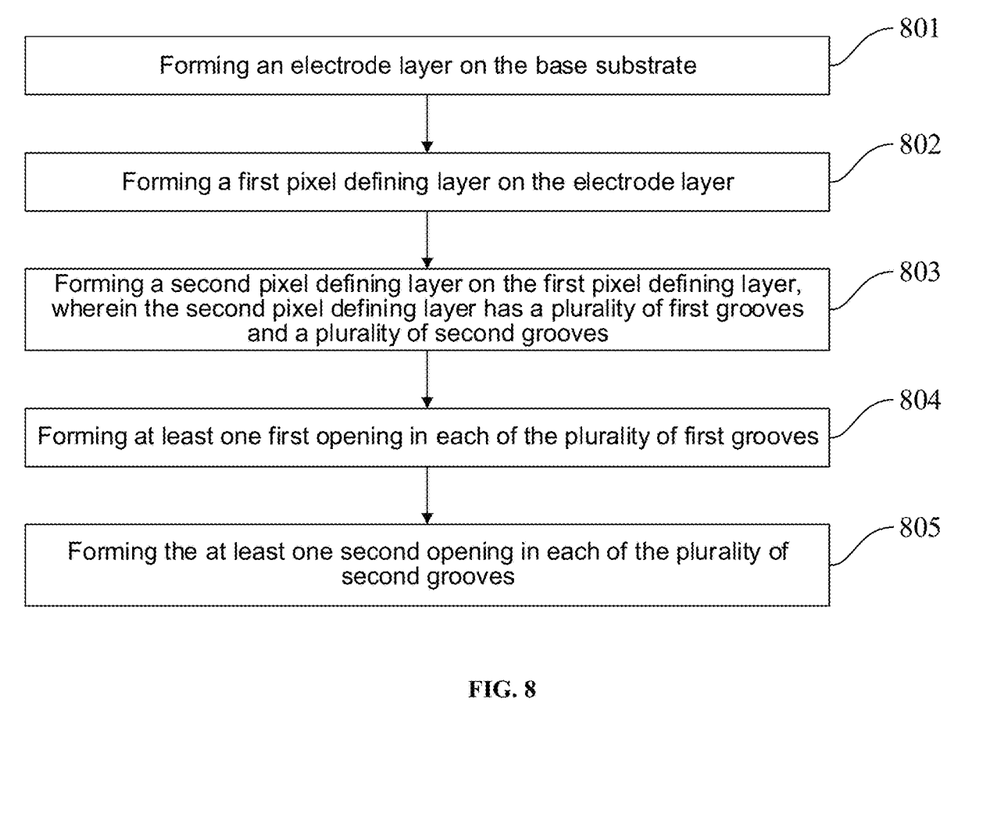
FIG. 8 shows a flow diagram of a method of fabricating an array substrate according to an embodiment of the present disclosure.

The present disclosure also provides a method of fabricating the array substrate. FIG. 8 shows a flow diagram of a method of fabricating an array substrate according to an embodiment of the present disclosure. The method comprises the following steps.

In step 801, an electrode layer is formed on the base substrate. The electrode layer 101 is generally an anode layer, and may be formed of any suitable material (for example, indium tin oxide (ITO)) and by any suitable means known to a person of ordinary skill in the art. There are no particular limitations on the base substrate 100, which may be formed of any suitable material known to a person of ordinary skill in the art. For example, the base substrate may be a glass substrate, a quartz substrate, a metal substrate, a resin substrate, and the like.

In step 802, a first pixel defining layer is formed on the electrode layer. A first pixel defining film is deposited on the electrode layer 101, and then the first pixel defining film is patterned to form the first pixel defining layer 102. The first pixel defining layer 102 demarcates the base substrate 100 into a plurality of pixel regions 103 arranged in a plurality of rows.

In step 803, a second pixel defining layer is formed on the first pixel defining layer at a position between two adjacent rows of pixel regions. The second pixel defining layer has a plurality of first grooves and a plurality of second grooves. A second groove is between two adjacent first grooves. There are no particular limitations on the process of forming the first grooves. For example, the first grooves 111 may be formed by an etching process (for example, dry etching or wet etching), or by any other suitable means known to a person of ordinary skill in the art.

To form the second pixel defining layer. a second pixel defining film is deposited on the first pixel defining layer 102, and then the second pixel defining film is patterned to form the second pixel defining layer 104. A double-patterning process is described above for forming the first and second pixel defining layers 102, 104. However, in some embodiments of the present disclosure, the first pixel defining layer 102 and the second pixel defining layer 104 may be formed simultaneously in a single patterning step, so as to simplify the production process. For example, a first pixel defining film is deposited on the first electrode layer, followed by the depositing of a second pixel defining film on the first pixel defining film. The first pixel defining film and the second pixel defining film are patterned simultaneously to form the first pixel defining layer and the second pixel defining layer, respectively.

In step 804, at least one first opening is formed in the first groove. At least one first opening 113 is formed on a portion of the first groove 111 adjacent to a pixel region 103 of a first color. The first opening 113 is configured to connect the first groove 111 to the pixel regions 103 of the first color. The first grooves 111 on adjacent rows of second pixel defining layers 104 are arranged so as to be staggered with respect to each other, and more particularly, the first grooves 111 on adjacent rows of second pixel defining layers 104 are staggered in the row direction of the pixel regions 103.

In step 805, at least one second opening is formed in the second groove. At least one second opening is formed in a portion of the second groove adjacent to a pixel region of a second color, the second color being different from the first color of the pixel regions adjacent to the first groove. The second opening 114 is configured to connect the second groove 111 to the pixel regions 103 of the second color.

Embodiments of the present disclosure utilize a double-layer structure for the pixel defining layers. A first pixel defining layer comprising a plurality of pixel regions is provided on a substrate. A second pixel defining layer is formed on the first pixel defining layer at a position between two adjacent rows of pixel regions. The second pixel defining layer has a plurality of first grooves and a plurality of second grooves. The first grooves and the second grooves are arranged in an alternating manner. A first opening is provided on at least one portion of a first groove adjacent to a pixel region of a first color. The first opening is configured to connect a plurality of pixel regions of the first color with the first groove. A second opening is provided on at least one portion of a second groove adjacent to a pixel region of a second color. The second opening is configured to connect a plurality of pixel regions of the second color with the second groove. The first color and the second color are different. When using inkjet printing to form the array substrate, light emitting materials are dispensed by the printer nozzles directly into the first and second grooves. More particularly, a light emitting material of the first color is directly deposited into the first groove, and the flows into the corresponding pixel regions that are connected to the first groove via the first opening. A light emitting material of the second color is deposited into the second groove, and flows into the corresponding pixel regions that are connected to the second groove via the second opening. The double-layer structure of the pixel defining layers makes is possible to simultaneously print light emitting layers in adjacent rows of pixel regions. An advantage of the embodiments of the present disclosure is that, without making extensive, wholesale modifications to existing inkjet printing equipment, print resolution can be significantly improved, and the ease of operating the inkjet printing equipment can be facilitated.

Figure 9:
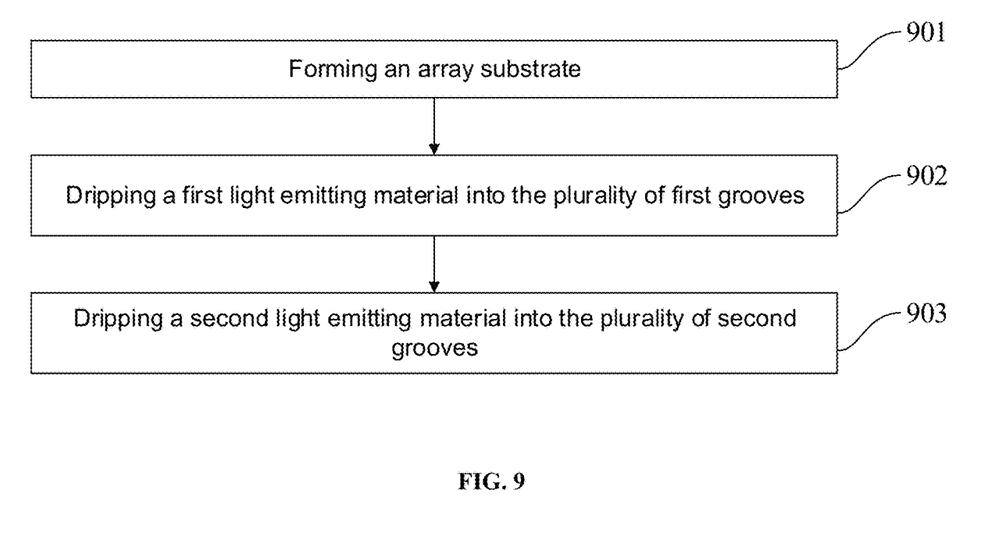
FIG. 9 shows a flow diagram of a method of fabricating a display panel according to an embodiment of the present disclosure.

The present disclosure also provides a method of fabricating a display panel incorporating an array substrate described herein. FIG. 9 shows a flow diagram of a method of fabricating a display panel according to an embodiment of the present disclosure. The method comprises the following steps.

In step 901, an array substrate as described herein is provided.

In step 902, a light emitting material having a first color is deposited in first grooves connected to corresponding pixel regions of the first color. The light emitting material deposited in the first grooves 111 flows into the corresponding pixel regions via the first openings 113 that are formed in the first grooves 111 to connect the first grooves 111 with those pixel regions.

The light emitting material may be a liquid organic material. The light emitting material in the pixel regions 103 dries to form the light emitting layer. The light emitting material may also be a liquid inorganic material, for example, quantum dots.

The pixel regions 103 are formed with identical, or substantially similar, properties (including surface properties), so that the light emitting material self-levels under the effect of surface tension and becomes uniformly distributed in each pixel region. As the light emitting material dries, the resulting light emitting layer is also uniformly distributed in each pixel region. Even if there are slight differences in the distribution of the light emitting layer in the pixel regions, the differences may be corrected through the first pixel defining layer.

The first grooves 111 in odd numbered rows of second pixel defining layers 104 are connected to pixel regions of the first color 103B, and the first grooves 111 in even numbered rows of second pixel defining layers 104 are connected to pixel regions of the third color 103C. Light emitting material having the first color is dripped in the first grooves 111 in odd numbered rows of second pixel defining layers 104, flows through first openings 113 in the first grooves into the corresponding pixel regions 103B, and dries to form light emitting layers that emit light of the first color. Light emitting material having the third color is dripped in the first grooves 111 in even numbered rows of second pixel defining layers 104, flows through first openings 113 in the first grooves into the corresponding pixel regions 103C, and dries to form light emitting layers that emit light of the third color.

In step 903, a light emitting material having a second color is deposited in second grooves connected to corresponding pixel regions of the second color. The light emitting material dripped in the second grooves 112 flows into the corresponding pixel regions via the second openings 114 in the second grooves 112 to connect the second grooves 112 with those pixel regions. Light emitting material dripped in the second grooves 112 have a different color from that of the light emitting material deposited in the first grooves 111.

In the embodiment illustrated in FIG. 1, since the second pixel defining layer 104 is not present on a side of the second groove 112 adjacent to the pixel regions 103, a printer nozzle having a larger volume may be used to dispense light emitting material having the second color simultaneously in both the second groove 112 and the two pixel regions 103A connected to the second grooves 112. The light emitting material will dry to form the corresponding light emitting layer.

Conversely, in the embodiment illustrated in FIG. 5, since the second pixel defining layer 104 is present on a side of the second groove 112 adjacent to the pixel regions 103, light emitting material having the second color is deposited in the second groove 112. The light emitting material then flows into the pixel regions of the second color 103A via the second openings 114.

The order in which steps 902 and 903 are performed is not limited to that described herein, and may be adjusted according to the requirements of the production process.

A person of ordinary skill in the art would readily appreciate that the configuration of a display panel is not limited to the embodiments of the present disclosure, and a display panel may include any additional components that are typically found in a display panel and/or that are provided according to any particular purpose for which the display panel is intended.

In a display panel incorporating an array substrate of the present disclosure, a light emitting material of the first color is directly dripped into the first groove, and flows into the corresponding pixel regions that are connected to the first groove via a first opening. A light emitting material of the second color is dripped into the second groove, and flows into the corresponding pixel regions that are connected to the second groove via a second opening. By adjusting the structure of the pixel defining layers, the present disclosure makes is possible to simultaneously print light emitting layers in multiple pixel regions, so that without requiring extensive modifications to existing inkjet printing equipment, remarkable improvements could be obtained in print resolution and the operation of the inkjet printing equipment could be greatly simplified.

It should be appreciated that changes could be made to the embodiments described above without departing from the inventive concepts thereof. It should be understood, therefore, that this invention is not limited to the particular embodiments disclosed, but it is intended to cover modifications within the spirit and scope of the present invention as defined by the appended claims.

What is claimed is:

1. An array substrate, comprising:
   a base substrate;
   an electrode layer on the base substrate; and
   a pixel defining layer on the electrode layer defining a plurality of sub-pixel regions arranged in columns and rows in the base substrate, wherein the sub-pixel regions in a same column of sub-pixel regions have a same color, and the sub-pixel regions in two adjacent columns of sub-pixel regions have different colors,
   wherein the pixel defining layer comprises: a plurality of vertical parts, each of which extending in a first direction between two adjacent columns of sub-pixel regions; and a plurality of horizontal parts, each of which extending in a second direction between two adjacent rows of sub-pixel regions,
   wherein at least one of the plurality of horizontal parts comprises a plurality of first grooves and a plurality of second grooves,
   wherein at least one of the plurality of first grooves connects to two adjacent sub-pixel regions in a same column of sub-pixel regions having a first color via two first openings, respectively, and at least one of the plurality of second grooves connects to two adjacent sub-pixel regions in a same column of sub-pixel regions having a second color, which is different from the first color, via two second openings, and
   wherein a width of the first opening in the second direction is smaller than a width of the sub-pixel region, which connects to one of the first grooves via the first opening, in the second direction, and the first opening is aligned with the sub-pixel region.

2. The array substrate according to claim 1, wherein in two adjacent rows of horizontal parts, the plurality of first grooves in one of the two rows of horizontal parts connect to the sub-pixel regions in columns of sub-pixel regions having the first color, and the plurality of first grooves in the other of the two rows of horizontal parts connect to the sub-pixel regions in columns of sub-pixel regions having a third color, which is different from the first color and the second color.

3. The array substrate according to claim 2, wherein the first openings in odd rows of horizontal parts are aligned with each other in the first direction, the first openings in even rows of horizontal parts are aligned with each other in the first direction, and the first openings in odd rows of horizontal parts and the first openings in even rows of horizontal parts are staggered with respect to each other in the first direction.

4. The array substrate according to claim 1, wherein the first openings connecting to a same column of sub-pixel regions are aligned with each other in the first direction, and the first openings connecting to different columns of sub-pixel regions are staggered with respect to each other in the first direction.

5. The array substrate according to claim 1, wherein bottom surfaces of the plurality of second grooves are coplanar with top surfaces of the plurality of vertical parts, the plurality of second grooves divided the horizontal part into a plurality of horizontal sub-parts, and the plurality of first grooves are arranged in the plurality of horizontal sub-parts, respectively.

6. The array substrate according to claim 5, wherein at least one of the plurality of horizontal sub-parts comprises a bottom and a raised portion extending in a third direction perpendicular to the first direction and the second direction along an edge of the bottom, and the first opening is arranged in the raised portion.

7. The array substrate according to claim 6, wherein at an intersection of the horizontal part and the vertical part, the horizontal part is at a position above the vertical part in the third direction.

8. The array substrate according to claim 1, further comprising a light-emitting layer formed in the plurality of sub-pixel regions and at least one of the first grooves,
   wherein a height of the light-emitting layer formed in the first groove with respect to the base substrate is higher than a height of the light-emitting layer formed in the plurality of sub-pixel regions with respect to the base substrate.

9. The array substrate according to claim 1, further comprising a light-emitting layer formed in the plurality of sub-pixel regions, the plurality of the first grooves and the plurality of the second grooves,
   wherein a width of the light-emitting layer formed in the plurality of first grooves in the second direction is different from a width of the light-emitting layer formed in the plurality of second grooves in the second direction.

10. The array substrate according to claim 1, wherein a thickness of the pixel defining layer at the vertical part is smaller than a thickness of the pixel defining layer at at least one intersection of the horizontal part and the vertical part.

11. The array substrate according to claim 5, wherein a maximum length of the vertical part extending continuously in the first direction is longer than a distance between two adjacent first openings in one horizontal sub-part in the second direction.

12. The array substrate according to claim 1, wherein each sub-pixel region having the first color in the plurality of sub-pixel regions connects to the first groove via the first opening, and two adjacent rows of sub-pixel regions in a same column of sub-pixel regions connect to a same first groove;

each sub-pixel region having the second color in the plurality of sub-pixel regions connects to the second groove via the second opening, and two adjacent rows of sub-pixel regions in a same column of sub-pixel regions connect to a same second groove.

13. The array substrate according to claim 3, wherein the plurality of horizontal sub-parts comprises a first horizontal sub-part and a second horizontal sub-part, the first groove arranged in the first horizontal sub-part has a first length in the second direction, the first groove arranged in the second horizontal sub-part has a second length in the second direction, and the second groove has a third length in the second direction,     the first length is longer than the second length, and the second length is longer than the third length.

14. The array substrate according to claim 1, wherein at least a portion of the plurality of first grooves and the plurality of second grooves have different lengths extending in the second direction.

15. The array substrate according to claim 1, wherein at least one of the plurality of horizontal parts has a first width in the first direction, at least one of the plurality of vertical parts has a second width in the second direction, and the first width is bigger than the second width.

16. The array substrate according to claim 1, wherein the pixel defining layer further comprises a peripheral part surrounding the plurality of sub-pixel regions,     a distance between a top surface of the base substrate and a top surface of the peripheral part is substantially equal to a distance between the top surface of the base substrate and a top surface of the vertical part.

17. The array substrate according to claim 16, wherein the peripheral part has a third width in the first direction, and has a forth width in the second direction, the third width is different from the forth width.

18. The array substrate according to claim 16, wherein the third width is bigger than the forth width.

19. The array substrate according to claim 1, wherein the plurality of vertical parts and the plurality of horizontal parts of the pixel defining layer are formed in a single structure.

20. A display panel, comprising the array substrate according to claim 1.

* * * * *